United States Patent
Lee et al.

(10) Patent No.: US 6,559,506 B1
(45) Date of Patent: May 6, 2003

(54) IMAGING ARRAY AND METHODS FOR FABRICATING SAME

(75) Inventors: Ji Ung Lee, Niskayuna, NY (US); George Edward Possin, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/115,829

(22) Filed: Apr. 3, 2002

(51) Int. Cl.[7] .......................... H01L 27/01; H01L 27/12; H01L 31/0392
(52) U.S. Cl. .................. 257/350; 257/347; 257/296
(58) Field of Search ........................... 257/296, 347, 257/350

(56) References Cited

U.S. PATENT DOCUMENTS

| | | |
|---|---|---|
| 4,725,890 A | 2/1988 | Yaniv et al. |
| 4,739,414 A | 4/1988 | Pryor et al. |
| 4,889,983 A | 12/1989 | Numano et al. |
| 5,202,575 A | 4/1993 | Sakai |
| 5,399,884 A | 3/1995 | Wei et al. |
| 5,435,608 A | 7/1995 | Wei et al. |
| 5,480,810 A | 1/1996 | Wei et al. |
| 5,532,180 A | 7/1996 | den Boer et al. |
| 5,587,591 A | 12/1996 | Kingsley et al. |
| 5,610,403 A | 3/1997 | Kingsley et al. |
| 5,610,404 A | 3/1997 | Possin |
| 5,614,727 A | 3/1997 | Mauri et al. |
| 5,631,473 A | 5/1997 | Possin et al. |
| 5,648,654 A | 7/1997 | Possin |
| 5,736,732 A | 4/1998 | Possin et al. |
| 5,777,355 A | 7/1998 | Possin et al. |
| 5,818,053 A | 10/1998 | Tran |
| 5,838,054 A | 11/1998 | Kwasnick et al. |
| 5,869,837 A | 2/1999 | Huang |
| 5,920,070 A | 7/1999 | Petrick et al. |
| 5,942,756 A | 8/1999 | Tran |
| 6,025,599 A | 2/2000 | Lee et al. |
| 6,031,234 A | 2/2000 | Albagli et al. |
| 6,133,614 A | 10/2000 | Shoji et al. |
| 6,167,110 A | 12/2000 | Possin et al. |
| 6,243,441 B1 | 6/2001 | Zur |
| 6,262,421 B1 | 7/2001 | Tran |
| 6,307,214 B1 * | 10/2001 | Ohtani et al. .................. 257/59 |
| 6,307,322 B1 * | 10/2001 | Dawson et al. .......... 315/169.1 |
| 6,462,802 B1 * | 10/2002 | Nishimura et al. ......... 349/147 |

* cited by examiner

*Primary Examiner*—Ngân V. Ngô
(74) *Attorney, Agent, or Firm*—Armstrong Teasdale LLP; Robert B. Reeser, III

(57) ABSTRACT

A radiation detector includes a top gate thin film transistor (TFT) including a source electrode, a drain electrode, a gate electrode, a TFT dielectric layer, a TFT semiconductive layer, and a TFT intrinsic amorphous silicon (a-Si) layer. The radiation detector also includes a capacitor including a first electrode, a second electrode substantially coplanar with the gate electrode, and a capacitor dielectric, the capacitor dielectric including a capacitor dielectric layer substantially coplanar with the TFT dielectric layer, a capacitor semiconductive layer substantially coplanar with the TFT semiconductive layer, and a capacitor a-Si layer substantially coplanar with the TFT a-Si layer.

14 Claims, 5 Drawing Sheets

US 6,559,506 B1

IMAGING ARRAY AND METHODS FOR FABRICATING SAME

BACKGROUND OF THE INVENTION

This invention relates generally to imaging arrays, and more particularly, to pixel formations for imaging arrays.

Imaging arrays typically include a photosensor array coupled to a scintillating medium. Radiation absorbed in the scintillator generates optical photons which in turn pass into a photosensor, such as a photodiode. The photon is absorbed in the photosensor and an electrical signal corresponding to an incident photon flux is generated. Hydrogenated amorphous silicon (a-Si:H) is commonly used in the fabrication of photosensors due to advantageous photoelectric characteristics of a-Si:H and a relative ease of fabricating such devices. In particular, photosensitive elements, such as photodiodes, can be formed in connection with necessary control or switching elements, such as thin film transistors (TFTs), in a relatively large array. Radiation detectors and display arrays are typically fabricated on a large substrate on which many components, including TFTs, address lines, capacitors, and devices such as photosensors, are formed through the deposition and patterning of layers of conductive, semiconductive, and insulative materials.

At least one known fabrication process for such a TFT array typically includes fabricating a bottom gate TFT and data and scan address lines. In some known bottom gate TFT's, the bottom gate metal shields a channel region, i.e. acts as a light blocking element, blocking light from a back light. The light blocking layer is desirable since photons can create an undesirable leakage in the TFT. For example, in a digital X-ray panel, the light is created from the scintillator that is deposited on the top of the devices, therefore the TFT regions are directly exposed to the photons. Therefore, an additional light blocking layer, requiring an additional photolithography level, is therefore necessary to shield the TFT channel region from undesirable light.

BRIEF SUMMARY OF THE INVENTION

In one aspect, a radiation detector is provided. The radiation detector includes a top gate thin film transistor (TFT) including a source electrode, a drain electrode, a gate electrode, a TFT dielectric layer, a TFT semiconductive layer, and a TFT intrinsic amorphous silicon (a-Si) layer. The radiation detector also includes a capacitor including a first electrode, a second electrode substantially coplanar with the gate electrode, and a capacitor dielectric, the capacitor dielectric including a capacitor dielectric layer substantially coplanar with the TFT dielectric layer, a capacitor semiconductive layer substantially coplanar with the TFT semiconductive layer, and a capacitor a-Si layer substantially coplanar with the TFT a-Si layer.

In another aspect, a method for fabricating a radiation detector is provided. The method includes forming a top gate thin film transistor (TFT) including a source electrode, a drain electrode, a gate electrode, a TFT dielectric layer, a TFT semiconductive layer, and an a-Si layer, and forming a capacitor including a first electrode, a second electrode substantially coplanar with the gate electrode, and a capacitor dielectric, the capacitor dielectric comprising a capacitor dielectric layer substantially coplanar with the TFT dielectric layer, a capacitor semiconductive layer substantially coplanar with the TFT semiconductive layer, and a capacitor a-Si layer substantially coplanar with the TFT a-Si layer.

In a further aspect, an imaging system including a radiation source and a radiation detector is provided. The radiation detector includes a top gate thin film transistor (TFT) including a source electrode, a drain electrode, a gate electrode, a TFT dielectric layer, a TFT semiconductive layer, and a TFT intrinsic amorphous silicon (a-Si) layer. The radiation detector also includes a capacitor including a first electrode, a second electrode substantially coplanar with the gate electrode, and a capacitor dielectric, the capacitor dielectric including a capacitor dielectric layer substantially coplanar with the TFT dielectric layer, a capacitor semiconductive layer substantially coplanar with the TFT semiconductive layer, and a capacitor a-Si layer substantially coplanar with the TFT a-Si layer.

In a still further aspect, a method for fabricating a radiation detector is provided. The method includes, forming a capacitor second electrode and a gate electrode in a single process step, forming a capacitor dielectric and a TFT dielectric layer in a single process step, and forming a capacitor semiconductor layer and a TFT semiconductive layer in a single process step.

DETAILED DESCRIPTION OF THE INVENTION

Figure 1:
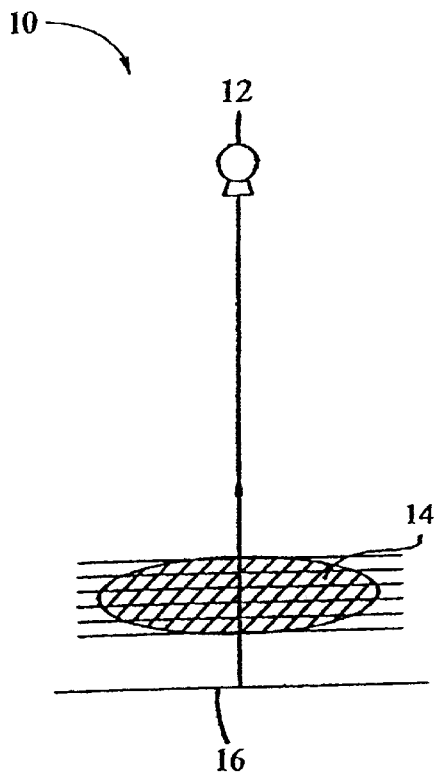
FIG. 1 is a pictorial view of an imaging system.

FIG. 1 is a pictorial view of an imaging system 10. In one embodiment imaging system 10 is a medical imaging system, such as, but not limited to, a Sennovision 2000D which is commercially available from the GE Medical Systems business of General Electric Corporation, Milwaukee, Wis., with the below described radiation detector installed. Imaging system 10 includes a radiation source 12 which projects a cone-shaped beam. In one embodiment, radiation source 12 is an x-ray source 12, and the cone-shaped beam is an x-ray beam. The X-ray beam passes through an object 14, i.e. an object being imaged such as a patient. The X-ray beam, after being attenuated by object 14, impinges upon a radiation detector 16.

Figure 2:
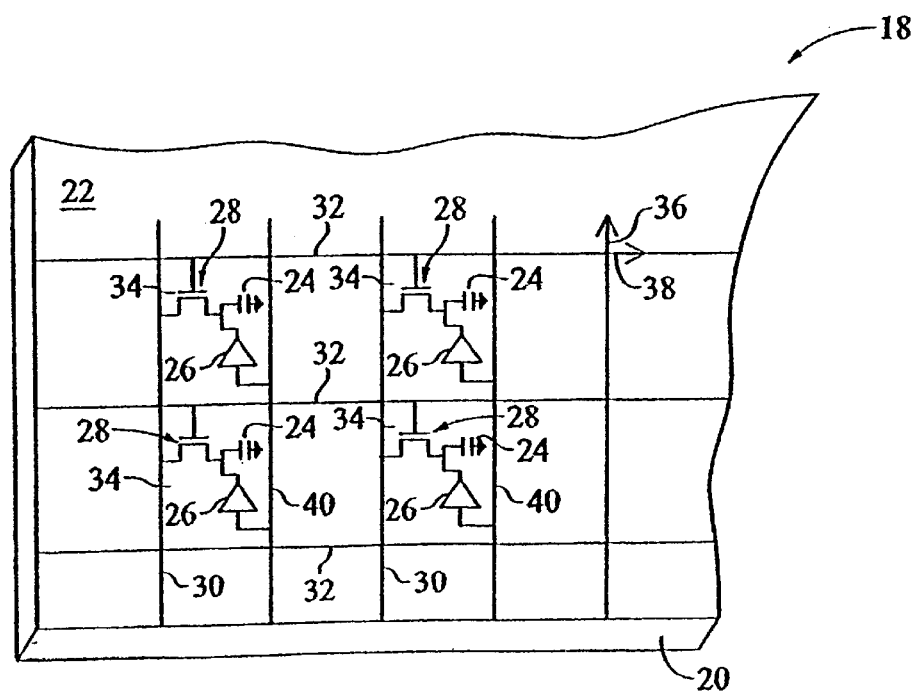
FIG. 2 is schematic illustration of a representative pixel in a photosensor array.

FIG. 2 is a radiation detector 18 that may be used with imaging system 10 (shown in FIG. 1). Radiation detector 18 includes a substrate 20 on which a pixel array 22 (sometimes called a photosensor array) is disposed. Photosensor array 22 includes a plurality of electronic components, such as capacitors 24, photodiodes 26, and switching devices 28, such as TFTs. TFTs 28 are disposed on array 22 to selectively couple a respective capacitor 24 and photodiode 26 to a respective data line 30. Photosensor array 22 also includes a plurality of scan lines 32 for addressing a plurality of individual pixels 34. Data lines 30 are oriented along a first axis 36 of pixel array 22, and scan lines 32 are oriented along a second axis 38 of pixel array 22. First and second axes, 36 and 38, of pixel array 22, are disposed substantially perpendicular to each other.

For ease of illustration in FIG. 2, only a few of data lines 30, scan lines 32, and common lines 40 are shown extending across photosensor array 22. Data lines 30, scan lines 32, and common lines 40 are arranged in rows and columns such that individual pixels 34 in photosensor array 22 are addressable by one data line 30, one scan line 32, and one common line 40. In one embodiment, data lines 30, scan lines 32, and common lines 40 include a conductive material, such as molybdenum, chromium, and/or aluminum. Capacitors 24 electrically contact photodiodes 26, and are electrically coupled to data lines 30 through TFTs 28. Photodiodes 26 include an active portion of array 22 that is responsive to incident photons and produce electric signals corresponding to a detected incident light. An x-ray energy is converted to visible light energy by passing through a layer of phosphor (not shown), such as cesium iodide, which is disposed near the surface of photodiodes 26. Capacitors 24 store a charge generated in photodiode 26 and discharge this stored charge through TFT 28 when scan line 32 is addressed.

Figure 3:
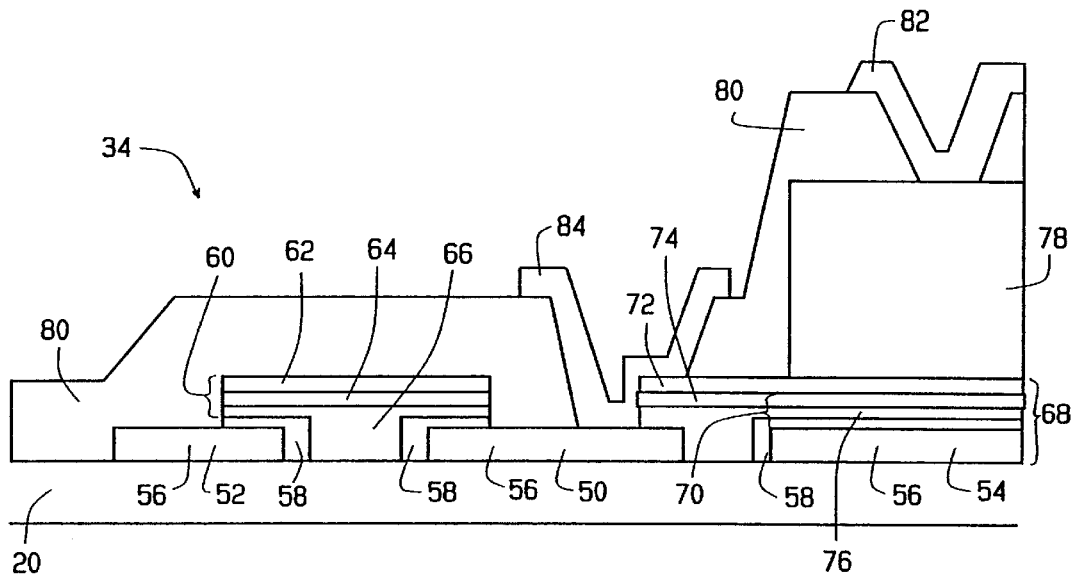
FIG. 3 is a cross-sectional view of a portion of a pixel of a radiation detector.

FIG. 3 is a cross-sectional view of a portion of pixel 34 formed on substrate 20. In an exemplary embodiment, all semiconductor layers and dielectric layers described herein are deposited by plasma enhanced chemical vapor deposition (PECVD). Pixel 34 includes a source electrode 50, a drain electrode 52, and a first capacitor electrode 54 formed from a first metallic layer 56, extending over a surface of substrate 20. First metallic layer 56 is formed such that drain electrode 52 and data line 30 (shown in FIG. 2) are formed unitarily, and source electrode 50, drain electrode 52, and first capacitor electrode 54 are approximately equal in thickness. An intrinsic, n-doped, a-Si layer 58 is formed on and between source/drain electrodes 50, and 52, and on and adjacent to first capacitor electrode 54. As used herein, "formed" includes processes to fabricate each component of pixel 34, including, but not limited to, patterning, masking, depositing, and etching.

A TFT stack 60 is formed over and between a-Si layer 58 and on substrate 20. "TFT stack" as used herein, refers to a TFT gate electrode 62 extending over a surface of a TFT dielectric layer 64 which extends over a surface of a TFT semiconductive material layer 66, such as intrinsic amorphous silicon. In one embodiment, gate electrode 62 is formed unitarily with scan line 32 (shown in FIG. 2). A storage capacitor 68 includes first storage capacitor electrode 54, a capacitor dielectric 70, and a second capacitor electrode 72 extending over a surface of a capacitor dielectric layer 74. In one embodiment, capacitor dielectric 70 includes capacitor dielectric layer 74 extending over a surface of a capacitor semiconductive material layer 76, such as intrinsic amorphous silicon, extending over a surface of an intrinsic, n-doped, a-Si layer 58 wherein a-Si layer 58 extends over a surface of, and adjacent to, first capacitor electrode 54. In an alternative embodiment, capacitor dielectric 70 includes capacitor dielectric layer 74 extending over a surface of a semiconductive material layer 76, such as intrinsic amorphous silicon.

A diode stack 78 is formed on second capacitor electrode 72. In one embodiment, diode stack 78 includes a PIN diode (not shown). The PIN diode includes a layer of p+ material deposited on a layer of intrinsic a-Si which is deposited on a layer of n+ material. A passivation layer 80 is formed over, diode stack 78, and exposed portions of gate electrode 62, source electrode 50, drain electrode 52, second capacitor electrode 72, and substrate 20. A common via 82 and a source via 84 are formed such that common via 82 is electrically connected to diode stack 78 and source via 84 is electrically connected to source electrode 50 and second capacitor electrode 72.

Figure 4:
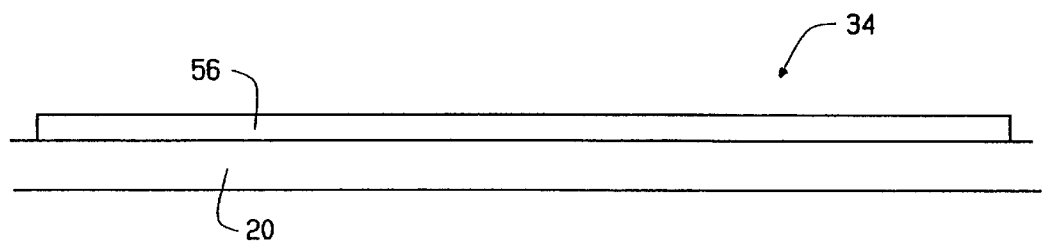
FIG. 4 is a cross-sectional view of a portion of the pixel shown in FIG. 3 during an initial fabrication stage.
Figure 5:
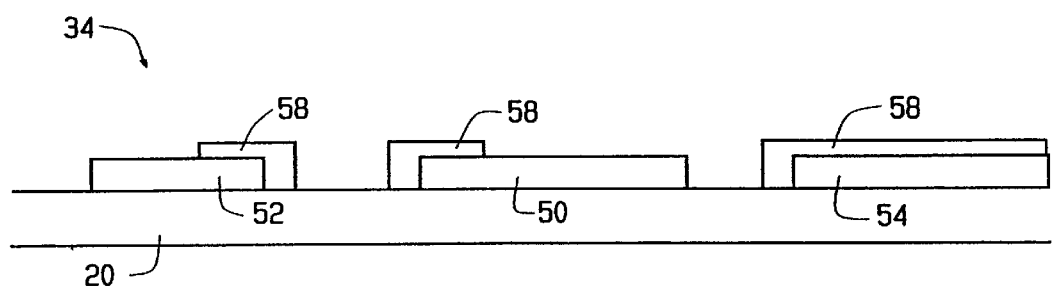
FIG. 5 is a cross-sectional view of a portion of the pixel shown in FIG. 3 during a first subsequent fabrication stage.

FIGS. 4 and 5 are cross-sectional views of a portion of pixel 34 shown in FIG. 3 during an initial fabrication stage and a first subsequent fabrication stage respectively. Semiconductor and dielectric layers are deposited by plasma enhanced chemical vapor deposition (PECVD).

In one embodiment, first metallic layer 56 is deposited, in a single metallization step, on substrate 20. During metallization, a metallic material is deposited by sputtering or is deposited by evaporating a thin layer of a metallic material. Alternatively, the metallic material is deposited other than by sputtering or evaporating. First metallic layer 56 may include, but is not limited to, aluminum, chromium, and/or molybdenum. First metallic layer 56 is patterned and etched to expose source/drain electrodes 50, 52, and first capacitor electrode 54. A patterning process includes, but in not limited to, depositing photoresist, exposing photoresist in accordance with a desired pattern, and processing photoresist to remove portions thereof, leaving a mask having a selected pattern corresponding to desired dimensions.

In one embodiment, an n-doped, a-Si layer 58 is deposited on source/drain electrodes 50, 52, and first capacitor electrode 54. N-doped a-Si layer 58 is patterned and etched prior to depositing a substantially intrinsic a-Si semiconductive material layer 66 (shown in FIG. 3). N-doped a-Si layer 58 enhances desirable electron injection and suppresses undesirable hole injection into semiconductor layer 66. In one embodiment, the thickness of a-Si layer 58 is between approximately 100 angstroms(Å) and approximately 3000 Å thick. In another embodiment, a-Si layer 58 is approximately 400 Å thick. In a further embodiment, a-Si layer 58 is between approximately 200 Å and approximately 600 Å thick.

Figure 6:
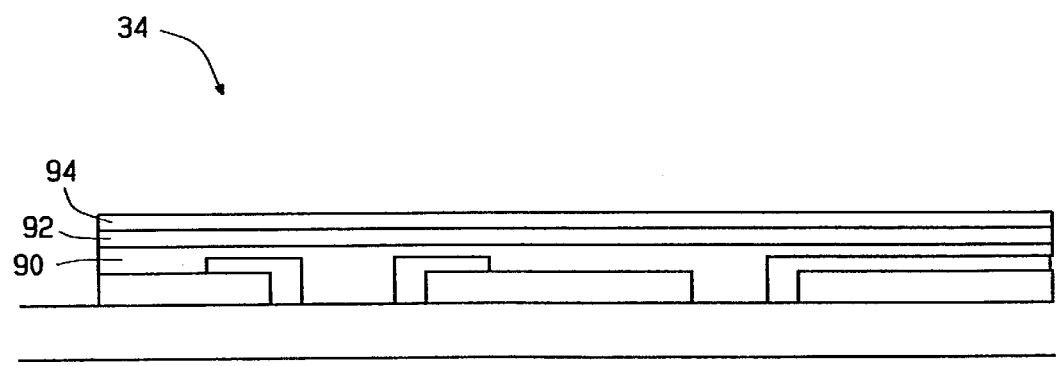
FIG. 6 is a cross-sectional view of a portion of the pixel shown in FIG. 3 during a second subsequent fabrication stage.
Figure 7:
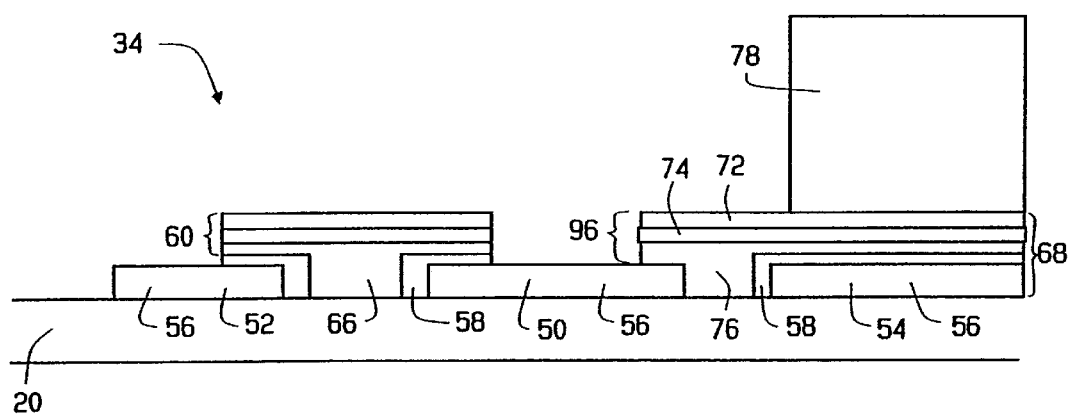
FIG. 7 is a cross-sectional view of a portion of the pixel shown in FIG. 3 during a third subsequent fabrication stage.

FIGS. 6 and 7 are cross-sectional views of a portion of pixel 34 shown in FIG. 3 during second and third subsequent fabrication stages, respectively. A semiconductive material layer 90 is deposited on a-Si layer 58. Semiconductive material layer 90 is not etched at this point. In one embodiment, the thickness of semiconductive material layer 90 is between approximately 100 Å and approximately 3000 Å thick. In another embodiment, semiconductive material layer 90 is approximately 500 Å thick. In a further embodiment, semiconductive material layer 90 is between approximately 300 Å and approximately 700 Å thick. Semiconductive material layer 90 may include, but is not limited to, intrinsic amorphous silicon.

A dielectric layer 92 is deposited on semiconductive material layer 90. Dielectric layer 92 is not etched at this point. In one embodiment, the thickness of dielectric layer 92 is between approximately 1000 Å and approximately 4000 Å thick. In another embodiment, dielectric layer 92 is approximately 2500 Å thick. In a further embodiment, dielectric layer 92 is between approximately 1500 Å and approximately 3500 Å thick. Dielectric layer 92 includes, but is not limited to, SiN.

A second metallic layer 94 is deposited on dielectric layer 92. In one embodiment, the thickness of second metallic layer 94 is between approximately 500 Å and approximately 5000 Å thick. In another embodiment, second metallic layer 94 is approximately 2500 Å thick. In a further embodiment second metallic layer 94 is between approximately 1500 Å and approximately 3500 Å thick. Second metallic layer 94 may include, but is not limited to, molybdenum, aluminum, and/or chromium.

Diode stack 78 is deposited on second capacitor electrode 72 without any intervening patterning step. In one embodiment, diode stack 78 includes a p+ layer, a substantially intrinsic layer, and n+ a-Si layer. In an alternative embodiment a fourth transparent conducting top contact layer (not shown) is part of diode stack 78. In one embodiment, the diode top contact may include, but is not limited to, a transparent conductor such as indium tin oxide (ITO). Diode stack 78 is patterned and etched. The same mask may be used to first wet etch, or alternatively, dry etch the diode top contact, followed by a dry etching of diode stack 78. Alternatively, two separate masking steps can be used to define the diode top contact, smaller than diode stack 78, followed by patterning and etching diode stack 76.

Semiconductive material layer 90, dielectric layer 92, and second metallic layer 94 are patterned and etched to form TFT stack 60 and a portion 96 of storage capacitor 68. The etching process stops when first metallic layer 56 is contacted. In one embodiment, TFT stack 60 includes a TFT gate electrode 62 which is substantially coplanar with second capacitor electrode 72 and formed in the same process step from the same metallization, a TFT dielectric layer 64 which is substantially coplanar with capacitor dielectric layer 74 and formed in the same process step from the same deposited layers, and a TFT semiconductive material layer 66 which is substantially coplanar with semiconductive material layer 76 and formed in the same process step and from the same semiconductor material. In one embodiment, gate electrode 62 facilitates blocking light from an active TFT region.

Figure 8:
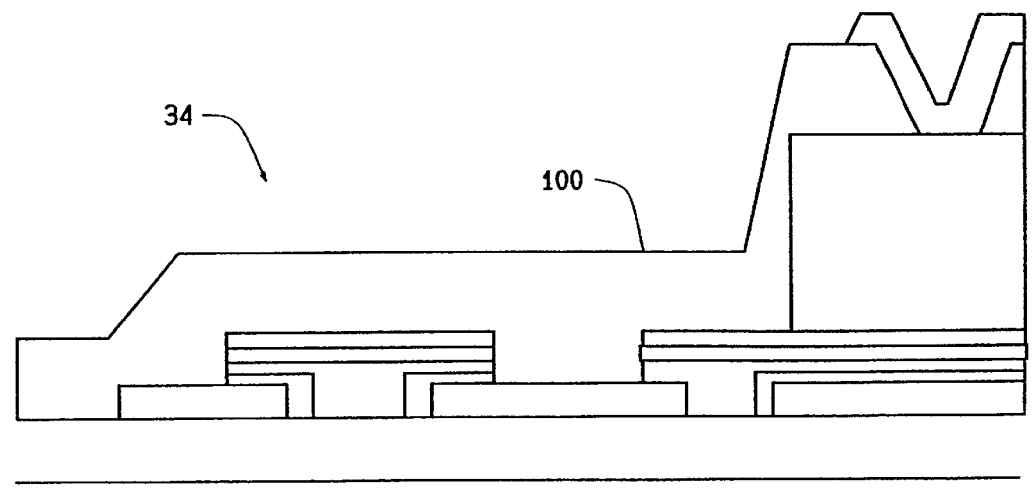
FIG. 8 is a cross-sectional view of a portion of the pixel shown in FIG. 3 during a fourth subsequent fabrication stage.
Figure 9:
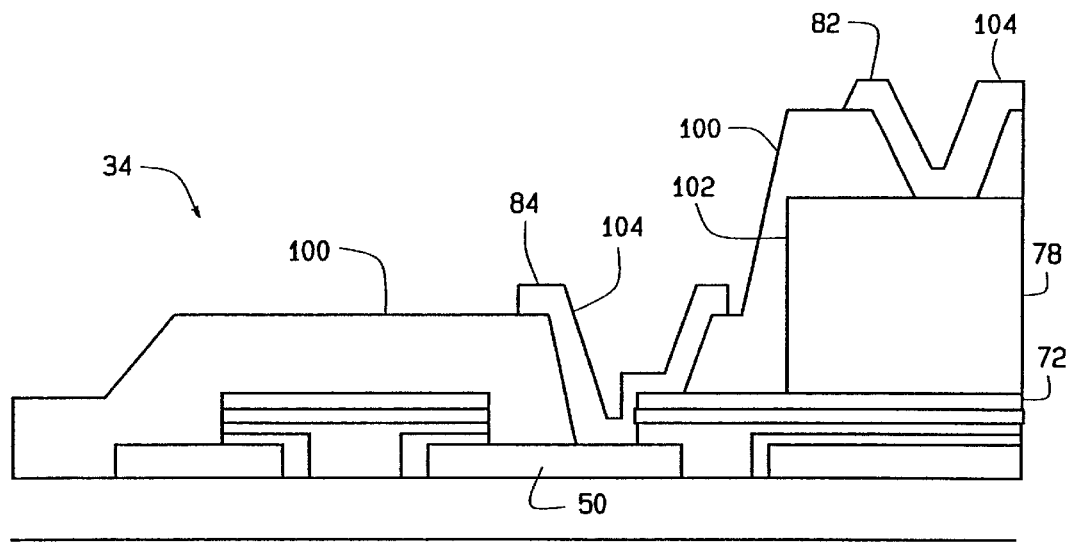
FIG. 9 is a cross-sectional view of a portion of the pixel shown in FIG. 3 during a fifth subsequent fabrication stage.

FIGS. 8 and 9 are cross-sectional views of a portion of pixel 34 shown in FIG. 3 during fourth and fifth subsequent fabrication stages, respectively. During fabrication, a passivation layer 100 is deposited over pixel 34. Passivation layer 100 is etched to expose diode stack 78, second capacitor electrode 72, and source electrode 50. In one embodiment, the thickness of passivation layer 100 is between approximately 0.5 microns ($\mu$) and approximately 1.5$\mu$ thick. In another embodiment, passivation layer 100 is approximately 1.0$\mu$ thick. In a further embodiment, passivation layer 100 is between approximately 0.8$\mu$ thick and approximately 1.2$\mu$ thick. Passivation layer 100 includes, but is not limited to, silicon nitride and silicon oxide. Passivation layer 100 facilitates protecting a plurality of diode sidewalls 102 against mechanical and chemical damage in subsequent processing. Passivation layer 100 is etched and a third metallic layer 104 is deposited on pixel 34 to form common via 82 and source via 84. Common via 82 and source via 84 are formed in one etching step to provide access through a portion of passivation layer 100 (i.e. common via 82 and source via 84 are surrounded on all sides by remaining portions of common passivation layer 100) such that electrical contact can be made to underlying components. Finally, a barrier dielectric layer (not shown) is deposited over pixel 34, patterned and etched, to expose contact pads to scan lines 32, (shown in FIG. 2), common lines 40 (shown in FIG. 2), and data lines 30 (shown in FIG. 2) at an edge of array 18 (shown in FIG. 2). The barrier dielectric layer may include, but is not limited to silicon nitride.

Figure 10:
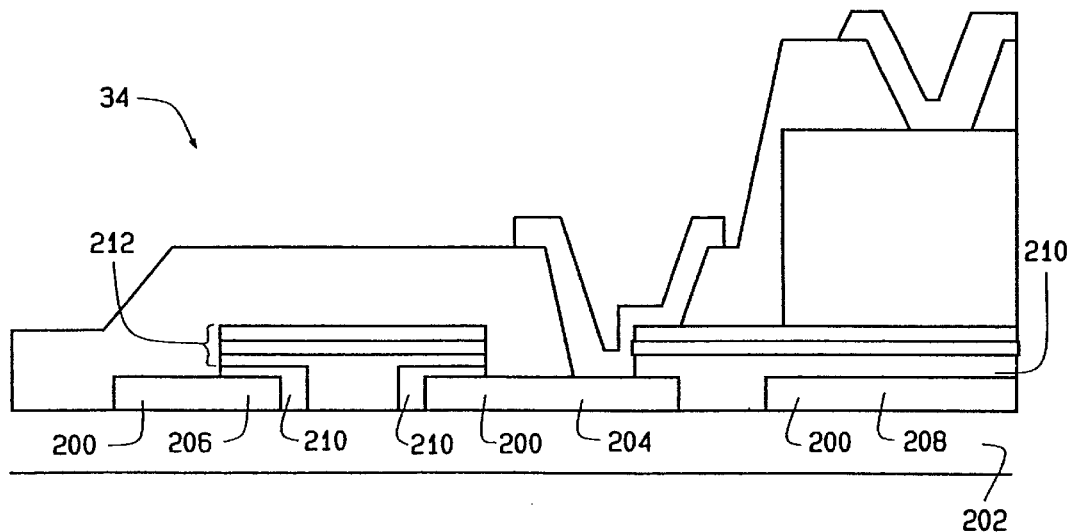
FIG. 10 is a cross-sectional view, of an alternative embodiment, of a portion of a pixel of a radiation detector.

FIG. 10 is a cross-sectional view, of an alternative embodiment, of a portion of a pixel 34 of a radiation detector. Semiconductor and dielectric layers are deposited by plasma enhanced chemical vapor deposition (PECVD). In one embodiment, an indium tin oxide (ITO) layer 200 is deposited in a single masking step on substrate 202. In one embodiment, a thin layer of n+ a-Si is used to form an ohmic contact. An ohmic contact facilitates supplying charge carriers to a semiconductor at a rate determined by charge transport through the semiconductor and not by the contact properties itself, therefore, current is limited by the conductivity of the semiconductor and not the contact. ITO layer 200 is patterned and etched to expose source/drain electrodes 204, 206, and first capacitor electrode 208. Source electrode 204 and drain electrode 206, are selectively treated with a silicon dopant (not shown) such as, but not limited to, phosphine plasma, prior to depositing an a-Si layer. Silicon dopant reacts with source electrode 204 and drain electrode 206 to selectively incorporate a phosphorous material 210 on the surface of source electrode 204 and drain electrode 206, and thereby modify TFTs 28 (shown in FIG. 2) electrical behavior and improve ohmic contact between source/drain electrodes 204, and 206.

In an exemplary embodiment, pixel 34 can be fabricated in the processing steps described herein, and effectively block incident light from the top of the active TFT region. In this type of application the principle source of light is from the X-ray scintillator on the top of array 22. Further, pixel 34 includes the following improvements. The TFT structure facilitates an improved performance because it is has a well-passivated back channel. Pixel 34 also includes a capacitor 68 with up to approximately three times the storage capacity of the self-capacitance of a typical a-Si pin diode. A scan/data line cross-over dielectric is a thick dielectric which is also used to passivate diode sidewall 102, and reduce cross-over capacitance and cross-over charge trapping. The diode passivation dielectric can be thick and optimized for the passivation function, and also function as an inter-level dielectric. The FET sandwich (intrinsic-Si, gate dielectric, gate metal) and the diode pin layers can be sequentially deposited without intervening patterning or cleaning steps. The thick diode passivation layer softens the common electrode bus steps over diode sidewall 102. The bottom contact metal etch stop for the diode island can be a thin metal such as Cr because it is not required to provide a low resistance path to the array edges for the scan and data lines. Using a thin metal such as chromium eliminates the need for thicker and more complex metalization such as Cr/Mo/Cr gate metal used in a prior reduced mask process. Third metallic layer 104, which forms data line 30 and common via 82, can be thick since it does not form the source-drain gap of the TFT, thereby facilitating a reduction of data line 30 resistance. Finally, pixel 30 interconnect wiring can be on the top level of pixel 30 simplifying repair and re-work.

While the invention has been described in terms of various specific embodiments, those skilled in the art will recognize that the invention can be practiced with modification within the spirit and scope of the claims.

What is claimed is:

1. A radiation detector comprising:
   a top gate thin film transistor (TFT) comprising a source electrode, a drain electrode, a gate electrode, a TFT dielectric layer, a TFT semiconductive layer, and a TFT intrinsic amorphous silicon (a-Si) layer; and
   a capacitor comprising a first electrode, a second electrode substantially coplanar with said gate electrode, and a capacitor dielectric, said capacitor dielectric comprising a capacitor dielectric layer substantially coplanar with said TFT dielectric layer, a capacitor semiconductive layer substantially coplanar with said TFT semiconductive layer, and a capacitor a-Si layer substantially coplanar with said TFT a-Si layer.

2. A radiation detector in accordance with claim 1 wherein said radiation detector further comprises a diode electrically coupled to said capacitor.

3. A radiation detector in accordance with claim 2 wherein said TFT further comprises a source via electrically coupled to said source electrode and a common via electrically coupled to said diode.

4. A radiation detector in accordance with claim 1 wherein said drain electrode and a data line are formed unitarily, said gate electrode and a scan line are formed unitarily, said common via and a common line are formed unitarily.

5. A radiation detector in accordance with claim 1 wherein said source electrode, said drain electrode, and said capacitor first electrode, comprises a chromium material, said capacitor dielectric layer and said TFT dielectric layer comprise silicon nitride, said capacitor semiconductive layer and said TFT semiconductive layer comprise intrinsic amorphous silicon, said capacitor a-Si layer and said TFT a-Si comprises n-doped intrinsic amorphous silicon.

6. A radiation detector in accordance with claim 1 wherein said capacitor a-Si layer and said TFT a-Si layer are each approximately 400 angstroms (Å) thick, said capacitor semiconductive layer and said TFT semiconductive layer are each approximately 500 angstroms (Å) thick, said TFT dielectric layer and said capacitor dielectric layer are approximately 2500 angstroms (Å) thick.

7. A radiation detector comprising:
   a top gate thin film transistor (TFT) comprising a source electrode, a drain electrode, a gate electrode, a TFT silicon nitride dielectric layer approximately 2500 angstroms (Å) thick, a TFT intrinsic amorphous silicon (a-Si) layer approximately 500 angstroms (Å) thick, and a TFT n-doped intrinsic a-Si layer approximately 400 angstroms (Å) thick; and
   a capacitor comprising a first electrode, a second electrode substantially coplanar with said gate electrode, and a capacitor dielectric, said capacitor di electric comprising a silicon nitride capacitor dielectric layer, approximately 2500 angstroms (Å) thick, and substantially coplanar with said TFT silicon nitride dielectric layer, a capacitor TFT intrinsic amorphous silicon (a-Si) layer approximately 500 angstroms (Å) thick, and substantially coplanar with said TFT intrinsic amorphous silicon (a-Si) layer, and a capacitor n-doped intrinsic a-Si layer approximately 400 angstroms (Å) thick, and substantially coplanar with said TFT ndoped intrinsic a-Si layer;
   a diode electrically coupled to said capacitor;
   a data line formed unitarily with said drain electrode;
   a scan line formed unitarily with said gate electrode; and
   a common line formed unitarily with a common via, said common via electrically coupled to said diode.

8. An imaging system comprising a radiation source, and a radiation detector comprising:
   a top gate thin film transistor (TFT) comprising a source electrode, a drain electrode, a gate electrode, a TFT dielectric layer, a TFT semiconductive layer, and a TFT amorphous silicon (a-Si) layer; and
   a capacitor comprising a first electrode, a second electrode substantially coplandar with said gate electrode, and a capacitor dielectric, said capacitor dielectric comprising a capacitor dielectric layer substantially coplandar with said TFT dielectic layer, a capacitator semiconductive layer substantially coplanar with said TFT semiconductives layer, and a capacitator a-Si layer substantially coplandar with said TFT a-Si layer.

9. An imaging system in accordance with claim 8 wherein said radiation detector further comprises a diode electrically coupled to said capacitor.

10. An imaging system in accordance with claim 9 wherein said TFT further comprises a source via electrically coupled to said source electrode and a common via electrically coupled to said diode.

11. An imaging system in accordance with claim 8 wherein said drain electrode and a data line are formed unitarily, said gate electrode and a scan line are formed unitarily, said common via and a common line are formed unitarily.

12. An imaging system in accordance with claim 8 wherein said source electrode, said drain electrode, and at least one of said capacitor electrodes, comprises a chromium material, said capacitor dielectric layer and said TFT dielectric layer comprise silicon nitride, said capacitor semiconductive layer and said TFT semiconductive layer comprise intrinsic amorphous silicon, said capacitor a-Si layer and said TFT a-Si comprise n-doped amorphous silicon.

13. An imaging system in accordance with claim 12 wherein said capacitor a-Si layer and said TFT a-Si layer are approximately 400 angstroms (Å) thick, said capacitor semiconductive layer and said TFT semiconductive layer are approximately 500 angstroms (Å) thick, said TFT dielectric layer and said capacitor dielectric layer are approximately 2500 angstroms (Å) thick.

14. An imaging system comprising a radiation source, and a radiation detector, wherein said radiation detector comprises:
   a top gate thin film transistor (TFT) comprising a source electrode, a drain electrode, a gate electrode, a TFT silicon nitride dielectric layer approximately 2500 angstroms (Å) thick, a TFT intrinsic amorphous silicon (a-Si) layer approximately 500 angstroms (Å) thick, and a TFT n-doped intrinsic a-Si layer approximately 400 angstroms (Å) thick; and
   a capacitor comprising a first electrode, a second electrode substantially coplanar with said gate electrode, and a capacitor dielectric, said capacitor dielectric comprising a silicon nitride capacitor dielectric layer, approximately 2500 angstroms (Å) thick, and substantially coplanar with said TFT silicon nitride dielectric layer, a capacitor TFT intrinsic amorphous silicon (a-Si) layer approximately 500 angstroms (Å) thick, and substantially coplanar with said TFT intrinsic amorphous silicon (a-Si) layer, and a capacitor n-doped intrinsic a-Si layer approximately 400 angstroms (Å) thick, and substantially coplanar with said TFT n-doped intrinsic a-Si layer;
   a diode electrically coupled to said capacitor, said diode comprising a diode stack, and a diode top contact;
   a data line formed unitarily with said drain electrode;
   a scan line formed unitarily with said gate electrode; and
   a common line formed unitarily with a common via, said common via electrically coupled to said diode top contact.

* * * * *

UNITED STATES PATENT AND TRADEMARK OFFICE
CERTIFICATE OF CORRECTION

PATENT NO. : 6,559,506 B1
DATED : May 6, 2003
INVENTOR(S) : Lee et al.

It is certified that error appears in the above-identified patent and that said Letters Patent is hereby corrected as shown below:

Column 7,
Line 22, after "TFT a-Si" insert -- layer --.
Line 23, delete "comprises" and insert therefor -- comprise --.
Line 41, delete "di electric" and insert therefor -- dielectric --.
Line 50, delete "ndoped" and insert therefor -- n-doped --.
Line 65, delete "coplandar" and insert therefor -- coplanar --.

Column 8,
Lines 2 and 6, delete "coplandar" and insert therefor -- coplanar --.
Line 5, delete "semiconductives" and insert therefor -- semiconductive --.
Line 22, after "TFT a-Si" insert -- layer --.

Signed and Sealed this

Seventh Day of October, 2003

JAMES E. ROGAN
*Director of the United States Patent and Trademark Office*